United States Patent [19]

Wolfinger

[11] 4,137,780
[45] Feb. 6, 1979

[54] APPARATUS FOR MONITORING PHASE CURRENTS AND TORSIONAL VIBRATIONS OF A TURBINE-GENERATOR

[75] Inventor: John F. Wolfinger, Schenectady, N.Y.

[73] Assignee: General Electric Company, Schenectady, N.Y.

[21] Appl. No.: 875,163

[22] Filed: Feb. 6, 1978

[51] Int. Cl.[2] ............................................. G01H 1/10
[52] U.S. Cl. ................................................. 73/650
[58] Field of Search .......................................... 73/650

[56] References Cited

U.S. PATENT DOCUMENTS 3,885,420  5/1975  Wolfinger ................................ 73/650

Primary Examiner—S. Clement Swisher
Assistant Examiner—John P. Beauchamp
Attorney, Agent, or Firm—John F. Ahern; James W. Mitchell

[57] ABSTRACT

Apparatus is described for monitoring phase currents and torsional vibrations of a turbine-generator which are indicative of the dynamic response of the machine during operation under load. The monitoring system disclosed includes probes which are operable to sense rotation of the main shaft of the turbine-generator and to feed the resulting signals to a vibration network. The vibration network eliminates from the signals any false components present at frequencies equal to multiples of the rate of rotation of the shaft and produces a composite vibration signal containing only true components of shaft torsional vibration. The composite vibration signal and a set of three phase current signals determined by stepping down, filtering, and amplifying the generator line currents are monitored continuously but recorded only when at least one of two signals derived from selected components of the composite vibration signal and phase current signals exceeds reference levels in an alarm system included in the monitor.

9 Claims, 5 Drawing Figures

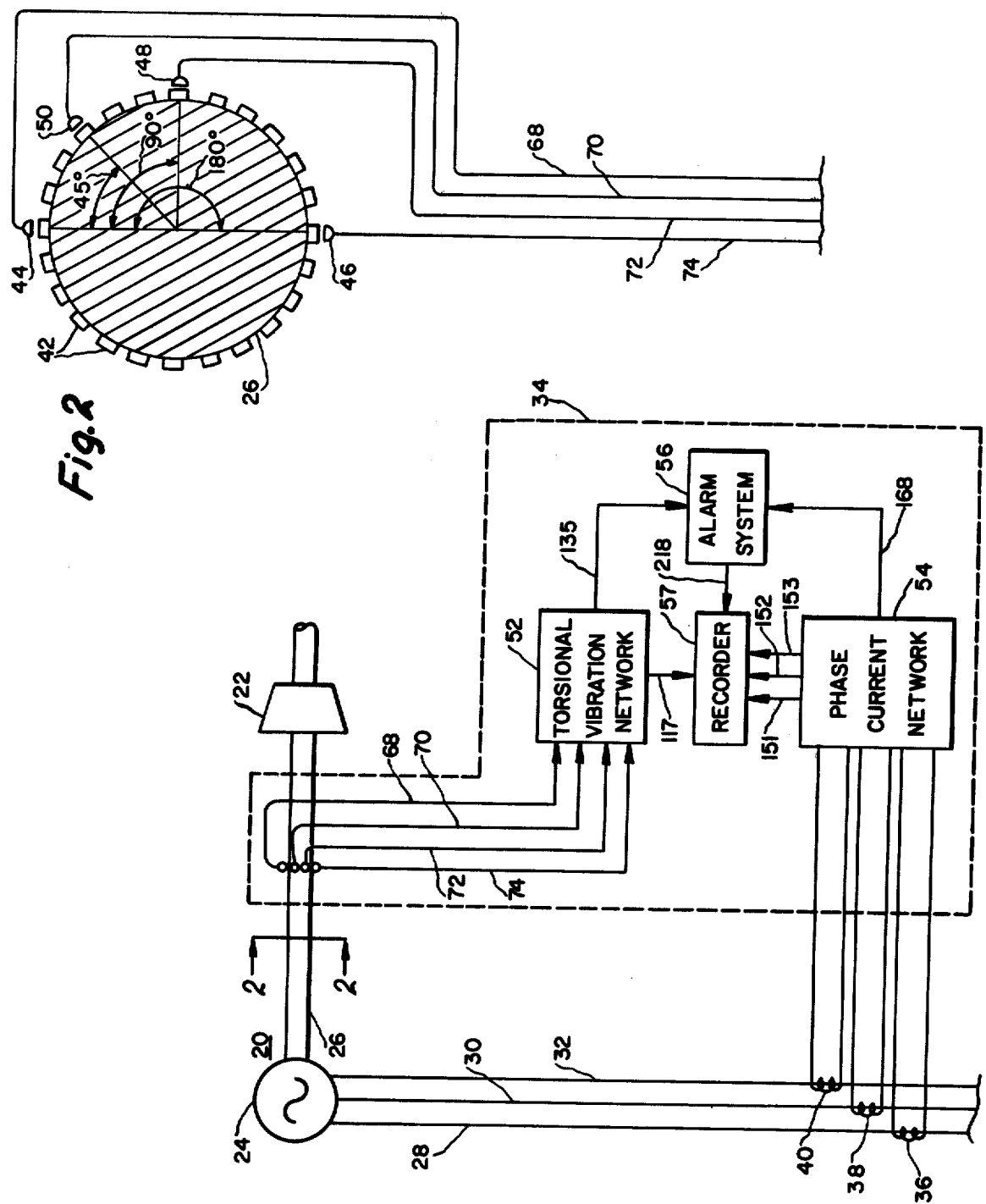

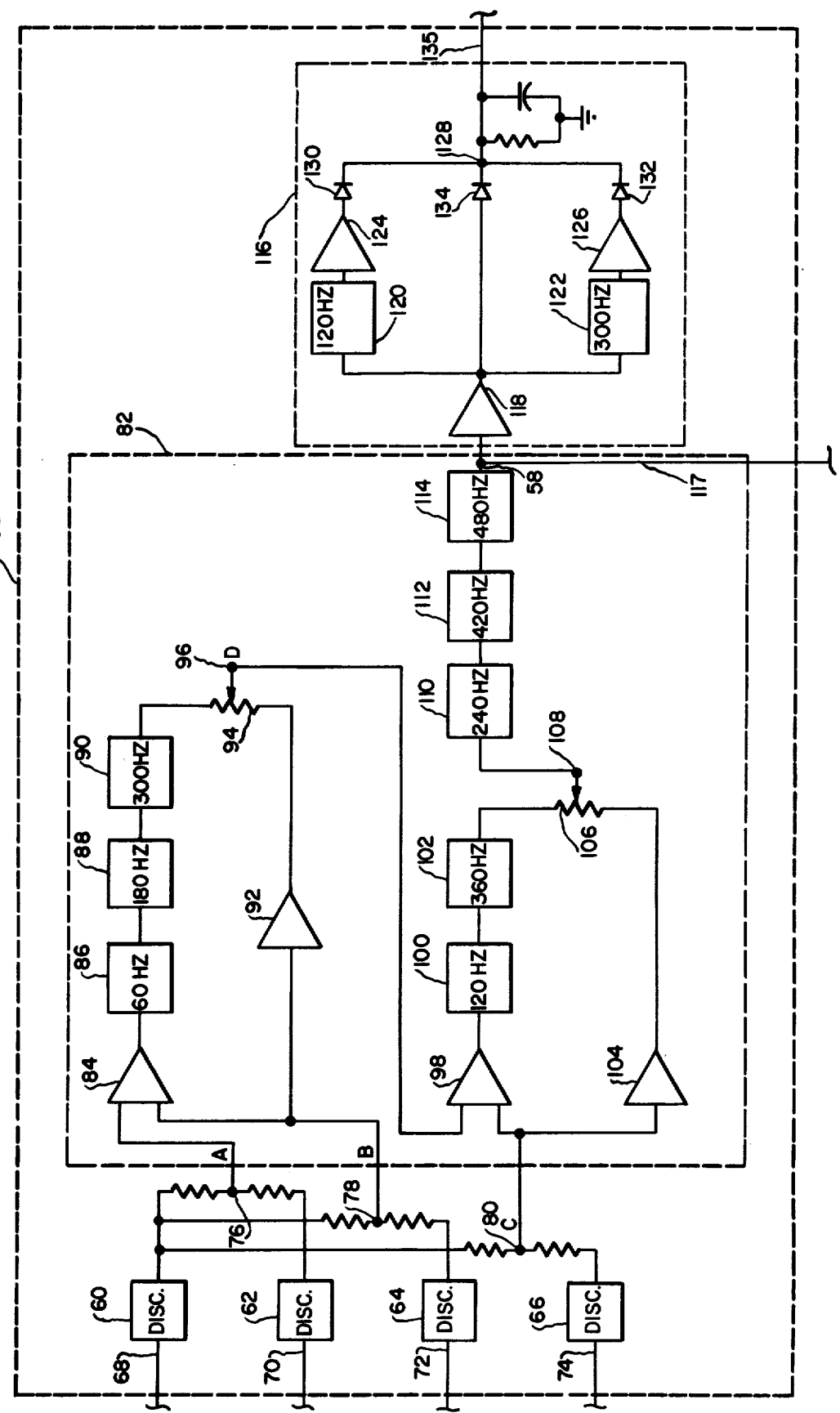

APPARATUS FOR MONITORING PHASE CURRENTS AND TORSIONAL VIBRATIONS OF A TURBINE-GENERATOR

CROSS-REFERENCE TO RELATED APPLICATIONS

Some of the subject matter disclosed in this application is also described in application U.S. Ser. No. 863,153, "Apparatus And Method For Measuring Torsional Vibration, " filed on Dec. 22, 1977, and application U.S. Ser. No. 792,661, "Torsional Oscillation Alarm System," filed on May 2, 1977, both in in the the name of J. F. Wolfinger, the applicant herein.

BACKGROUND OF THE INVENTION

This invention relates to apparatus for monitoring rotating machinery and in particular to a system for monitoring vibration and current signals in a turbine-generator.

In large machines such as steam turbine-generators used to produce electric power, vibrations and other dynamic responses related to operation of the turbine-generator and its associated load may, if inadequately monitored and controlled, result in substantial risk of damage to the machine. For example, torsional vibrations of the main rotating shaft of the turbine-generator causes stresses which can damage or break the shaft. Also, imbalance in the external load applied to the machine can produce unbalanced currents in the output phase lines of the generator. These unbalanced currents, and particularly harmonics thereof, may interact to create torques near the resonant frequencies of certain components such as turbine buckets, which may lead to cracking or breaking of these buckets.

In order to fully assess the response of the turbine-generator to torsional vibrations and unbalanced currents, it is necessary to accurately monitor these parameters, preferably on a continuous basis. It is also desirable to obtain a permanent record of the data obtained during monitoring for subsequent analysis of machine behavior and implementation of corrective procedures. However, since turbine-generators are generally required to operate over extended periods of time, permanent records should be generated only at specified times such as during intervals when vibrations or harmonics of phase currents exceed predetermined levels.

Accordingly, it is an object of the present invention to provide improved apparatus for monitoring current and vibration signals of a turbine-generator.

It is also an object of the present invention to provide a system for monitoring phase currents and torsional vibrations of a three-phase turbine-generator which will generate an alarm signal and record current and torsional vibration signals if phase currents or torsional vibrations exceed preselected reference levels.

A further object of the present invention is to provide a monitoring system which in addition to fulfilling the above objects, will separate true components of shaft torsional vibration from false components present at frequencies that are multiples of the rate of rotation of the shaft.

SUMMARY OF THE INVENTION

The invention provides a system for monitoring phase currents and torsional vibrations of a three-phase turbine-generator. In one form of the invention, the monitoring system includes a plurality of probes which are operable to sense the passage of elements rotating with the shaft of a turbine-generator; a torsional vibration network to process electrical signals from the probes; a phase current network to process stepped-down line current signals from each of the three output phase lines of the generator; and an alarm system and recorder responsive to signals from the torsional vibration network and phase current network. The vibration network is adapted to eliminate from the probe electrical signals all false components caused by inhomogeneities in the elements rotating with the shaft and to produce a composite vibration signal containing only true components of shaft torsional vibration. The phase current network includes three subnetworks to adjust and filter stepped-down generator line currents and determine three phase current signals. An alarm system provides means for comparing a composite current signal produced from selected components of the phase current signals with a first reference level and for comparing a signal produced from selected components of the composite vibration signal with a second reference level, and for generating an alarm signal when at least one of the reference levels is exceeded. A recorder is operable in response to the alarm signal to record the phase current signals and composite torsional vibration signal.

BRIEF DESCRIPTION OF THE DRAWINGS

While the specification concludes with claims particularly pointing out and distinctly claiming the subject matter regarded as the invention, the invention will be better understood from the following description taken in connection with the accompanying drawings in which:

FIG. 1 is a simplified block diagram of a turbine-generator and a preferred embodiment of the monitoring system of the invention;

FIG. 2 is a cross-sectional view of a portion of a turbine-generator shaft and elements rotatable therewith and a preferred arrangement of stationary probes associated with sensing of shaft vibrations;

FIG. 3 is an illustration, primarily in block diagram form, of a torsional vibration network suitable for use in the monitoring system;

DETAILED DESCRIPTION OF THE INVENTION

Figure 4:
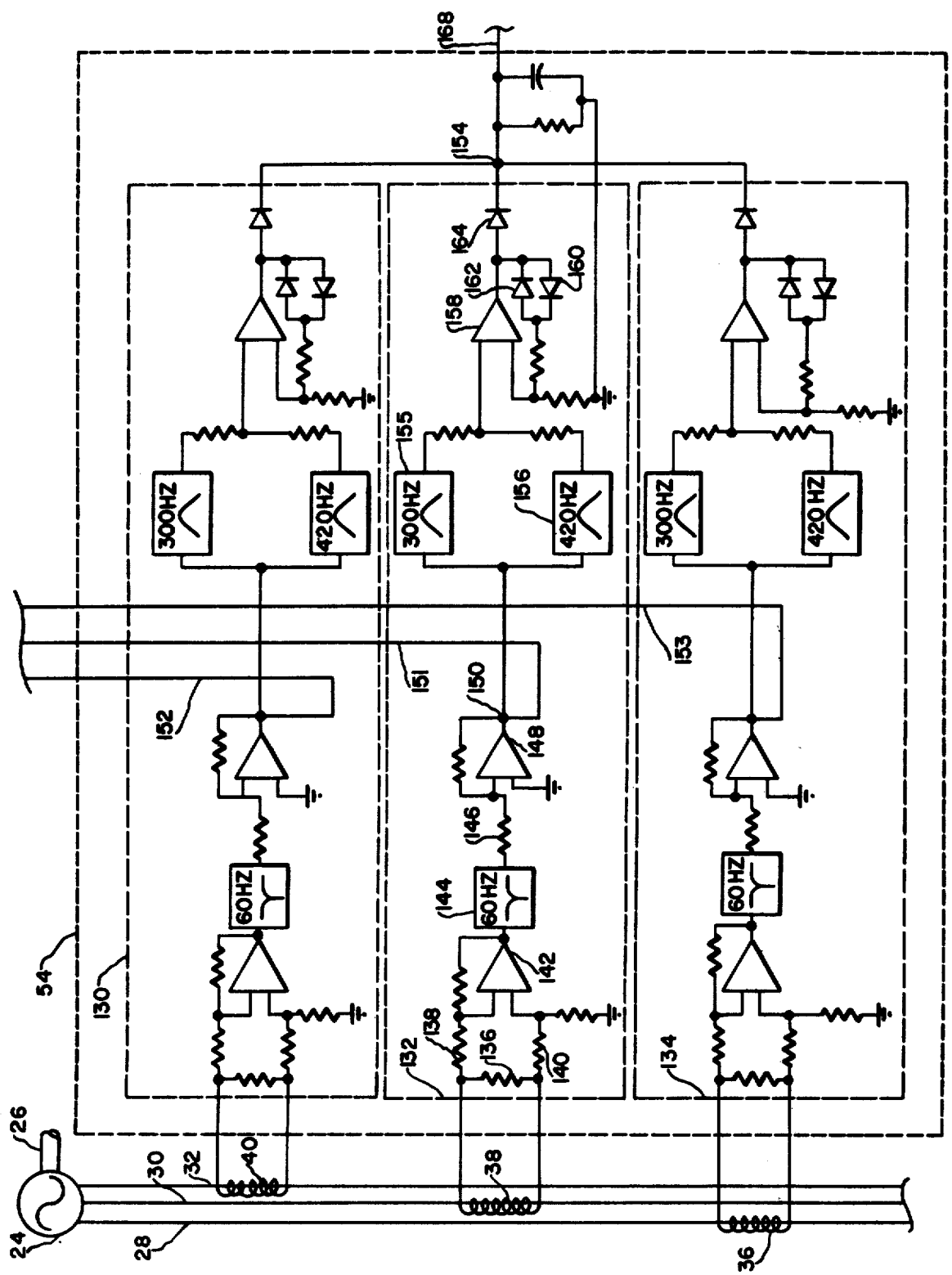
FIG. 4 is a diagram of a phase current network of the monitoring system.

FIG. 1 illustrates in simplified form a turbine-generator and a preferred embodiment of the novel apparatus for monitoring current and vibration signals from the turbine-generator. As shown, turbine-generator 20 includes at least one turbine section such as high-pressure turbine 22 and a generator 24 interconnected by a main shaft 26. Three phase lines 28, 30, and 32 emanate from generator 24 to carry line currents for transmission to an external load (not shown), and are electrically connected to monitoring system 34 by means of current transformers 36, 38, and 40. To permit monitoring of shaft torsional vibrations, (and now with reference to FIG. 2) a plurality of elements 42 are circumferentially spaced about the periphery of shaft 26 and rotate with shaft 26 to produce impulses detectable by stationary probes such as probes 44, 46, 48, and 50, which measure the instantaneous angular position of shaft 26. Elements 42 are typically metallic teeth of a gear concentrically attached to shaft 26 as, for example, part of one of the two couplings on either side of high-pressure turbine 22, but may be optically detectable stripes of different reflectivity than the shaft or any other arrangement suitable for rotation and detection.

In addition to probes 44, 46, 48 and 50, which are typically magnetic pickup devices sensitive to the passage of metallic teeth, monitoring system 34 also includes (FIG. 1) a torsional vibration network 52, phase current network 54, alarm system 56, and recorder 57, each of whose construction and operation are more fully described hereinafter.

A more detailed illustration of torsional vibration network 52 is given in FIG. 3; however, before describing the components and their functional interaction, it will be helpful to discuss certain aspects of shaft vibrations and the multiple probe arrangement of FIG. 2. The high sensitivity of equipment required to measure shaft torsional vibrations of interest, which may be as small as 0.01°, also results in sensing of inhomogeneities due, for example, to slightly irregular spacings of elements 42 or differences in their metallurgical composition. As elements 42 rotate with shaft 26, each inhomogeneity is sensed by a probe at a slightly different time than a perfect element would be, producing false components at frequencies equal to integral multiples of the shaft rotational speed (e.g., 30m hertz, m = 1,2,..., for a turbine-generator operating at 1800 rpm). To each individual probe such as probe 44, these false components are indistinguishable from true components of actual torsional vibrations. Since the false components also appear at harmonic frequencies of shaft speed, i.e., $f_o$ m where $f_o$ = shaft rotational speed in hertz and m = 1,2,3,..., an individual probe cannot be used to accurately monitor components of torsional vibrations at shaft rotational speed or harmonic frequencies thereof, which are often of considerable interest in assessing operating characteristics of the machine.

It has been found, however, that by providing multiple probes separated by predetermined angles and by appropriately combining the signals these probes sense from the rotating elements, false components at selected frequencies may be eliminated. This is possible since at any instant a torsional vibration can be sensed at any circumferential location around shaft 26 while an inhomogeneity can be sensed only at the particular location of the inhomogeneity. An inhomogeneity is thus sensed sequentially by any two probes, resulting in two signals with false components having phase differences between them whose magnitude depends on the separation angle between the two probes and the frequency of the false components. By suitable choice of separation angles, the phase differences may be set at 180° so that the false components cancel each other when the probe signals are combined. It can be shown by mathematic manipulation that the separation angle and frequencies of false components which can be eliminated are related by the expression $$f_m = f_o(2m + 1)\ 180/\theta \quad \text{(Equation 1)}$$

where $f_m$ = frequencies of false components eliminated (hertz);

$f_o$ = shaft rotational speed (hertz);

$\theta$ = separation angle between probes (degrees); and m = 0,1,2,3, ....

In the preferred embodiment of the invention shown in FIG. 2, four probes are used, and if the location of probe 44 is arbitrarily set at 0°, probes 46, 48, and 50 are located at 180, 90 and 45°, respectively. These probes sense the passage of elements 42 and provide electrical signals to torsional vibration network 52 which include true components representing torsional vibrations of shaft 26 and false components at frequencies that are multiples of the rate of rotation of the shaft.

The torsional vibration network 52 of FIG. 3 has two primary functions. First, it combines the electrical signals from probes 44, 46, 48, and 50 to produce a first vibration signal at terminal 58 which contains only true components of shaft torsional vibrations. Also, it produces a second vibration signal at point 128 from the first vibration signal and selected components thereof. The second vibration signal is subsequently used to determine whether an alarm should be activated and a recording made of the first vibration signal and the phase currents of turbine-generator 20.

As shown in FIG. 3, torsional vibration network 52 includes discriminators 60, 62, 64 and 66 which receive the electrical signals from probes 44, 46, 48, and 50 along input lines 68, 70, 72, and 74. Each discriminator is a phase-locked loop type frequency discriminator such as is described as elements 20 through 36 of U.S. Pat. No. 3,885,420 to Wolfinger, whose disclosure is incorporated herein by reference thereto. Phase discriminators 60, 62, 64 and 66 each produce first and second pulse trains representing the instantaneous and average angular position of shaft 26, and the output signal of each discriminator represents instantaneous changes in the angular position of the shaft from a uniformly increasing value. Since the discriminator output signals at terminals 68, 70, 72, and 74 include false components from element inhomogeneities as well as true components representing shaft vibrations, the output lines of discriminators 62, 64, and 66 are each separately connected to the output line of discriminator 60 to permit combining of the output signals and elimination of certain of the false components. For example, if Equation 1 is applied to probes 44 and 46 ($\theta$ = 180°) and their associated discriminators 60 and 62, it is seen that the combined signal at terminal 76 (signal A) contains no false components at $f_o(2m + 1)$, or, for a turbine-generator operating at 1800 rpm, no false components at 30, 90, 150, 210, 270, 330, 390, and 450 hertz. Similarly, the combined signal at point 78 (signal B) includes no false components at $2f_o(2m + 1)$, or 60, 180, 300, and 420 hertz; and the combined signal at terminal 80 (signal C) includes no false components at $4f_o(2m + 1)$, or 120 and 360 hertz. False components are also eliminated at higher frequencies than those listed above, but signal components at frequencies above 500 hertz are usually very small and of little importance, and discriminators 60, 62, 64, and 66 preferably each include a low pass filter which eliminates all signal components above 500 hertz.

To provide a single combined vibration signal which contains no false components and includes true components at shaft rotational speed and most harmonic frequencies thereof as well as at all frequencies in between, combined signals A, B, and C from terminals 76, 78, and 80 are further processed in filter network 82 of torsional vibration network 52. Signals A and B are fed through differential amplifier 84, whose output is then filtered by notch filters 86, 88, and 90, which, as with the other notch filters of torsional vibration network 52, may be of the simple two-pole type well known in the art and which remove signal components at 60, 180, and 300 hertz respectively. Signal B is also passed through amplifier 92 and added through trim potentiometer 94 to the output of notch filter 90. The two paths provided for signal B are equivalent to bandpassing the 60, 180, and 300 hertz components of signal B. Hence the signal at point 96 includes (from signal B) true components of shaft vibration at 60, 180, and 300 hertz; and (from signal A) true components at all frequencies not equal to an integral multiple of shaft rotational speed, true components at 30, 90, 150, 210, 270, 330, 390, 450 hertz, and components at 120, 240, 360, 420, and 480 hertz which may be false due to element inhomogeneities. To eliminate the false components at 120 and 360 hertz, the signal at point 96 (signal D) and signal C from point 80 are passed through differential amplifier 98 and then through series-connected notch filters 100 and 102, which remove respectively the 120 and 360 hertz components of these signals. Signal C is also fed to amplifier 104 and the resulting output is added through trim potentiometer 106 to the output of notch filter 102. The resulting signal at point 108 is a combination of signal D, with 120 and 360 hertz components removed, and the 120 and 360 hertz true components from signal C. The signal at point 108 still includes false components at 240, 420, and 480 hertz, which could be replaced by true components by the use of additional probes separated from probe 44 by angles calculated according to Equation 1 and of amplifiers and notch filters similar to the combinations described above. However, in the preferred embodiment of the invention shown in FIG. 3, the components at 240, 420, and 480 hertz are considered not of sufficient importance to warrant this added complexity and hence notch filters 110, 112, and 114 are provided to remove them. The resulting vibration signal at point 58 contains no false components and includes true components of shaft torsional vibrations at all frequencies except 240, 420, and 480 hertz. This vibration signal is fed to amplifier network 116 of torsional vibration network 52 for calculation of a second vibration signal and by line 117 to recorder 57 of monitoring system 34.

Within network 116, the vibration signal is amplified in amplifier 118, then passed through parallel-connected bandpass filters 120 and 122, which, as with the other bandpass filters of monitoring system 34, may be of the simple two-pole type well known in the art and which pass respectively the 120 hertz and 300 hertz components of the amplified signal. The 120 and 300 hertz components, which are representative of torsional vibration components at frequencies of particular interest with respect to initiating an alarm signal and recording of vibration signals, are then amplified in amplifiers 124 and 126 respectively. The output terminals of amplifiers 124, 126, and 118 are connected to point 128 through diodes 130, 132, and 134 respectively so that the resulting second vibration signal at point 128 is the maximum of the output signals from these amplifiers. The vibration signal at point 128 is fed along line 135 to alarm system 56 for determination of an alarm signal used to control recorder 57.

In addition to providing torsional vibration network 52 for combining signals from the main shaft of turbine-generator 20, monitoring system 34 also includes phase current network 54. Network 54 processes the three output line currents from generator 24 to produce three phase current signals which may be recorded for later analysis and also determines a composite current signal used for generating an alarm signal to control recorder 57. As shown in FIG. 4, current transformers 36, 38, and 40, which may be part of the existing equipment in a power-generating station, are provided to convert the high-amplitude line currents in phase lines 28, 30, and 32 to safe measurement levels of voltage and then direct these voltages to phase current network 54, which includes three sub-networks 130, 132, and 134. Since these sub-networks are identical, their construction and operation may readily be understood from a description of sub-network 132 alone.

Sub-network 132 is arranged to receive the stepped-down current signal from current transformer 38 and to regulate and adjust signal strength by means of resistors 136, 138, and 140 and differential amplifier 142. The output of differential amplifier 142 is passed through 60 hertz notch filter 144, which removes the power-generation operating or synchronous frequency components of 60 hertz, whose large amplitude would, if present, prevent recording of the much smaller harmonic components of interest and whose characteristics are readily determinable from the external load applied to turbine-generator 20. The filtered signal is fed through resistor 146, then amplified in amplifier 148 to yield a phase current signal at point 150 which is directed to recorder 57 along line 151. Similar phase current signals from sub-networks 130 and 134 are directed to recorder 57 along lines 152 and 153.

Since it is desirable to record the phase current signal only when the dynamic vibratory or phase current response of the turbine-generator is indicative of operating conditions potentially harmful to the machine, a composite current signal useful in generating an alarm is also produced at point 154. This signal is obtained by passing the phase current signal from point 150 through bandpass filters 155 and 156, amplifying the sum of the resulting signal by means of amplifier 158, whose feedback path includes voltage-compensating diodes 160 and 162, then directing the amplified or intermediate signal through diode 164, with the composite current signal at point 154 then determined as the maximum of the intermediate signals from sub-networks 130, 132, and 134. The components passed by filters 155 and 156 are typically those harmonics of the 60 hertz power generation frequency which are of particular interest because their interactions create torques which pulsate at frequencies close to the resonate frequencies of certain turbine-generator components. In the preferred embodiment of the invention shown in FIG. 4, filters 155 and 156 are tuned to pass respectively the 300 and 420 hertz signal components (fifth and seventh harmonics), which are of concern since if not monitored and controlled they may lead to 120 hertz torques harmful to turbine buckets of the machine.

Figure 5:
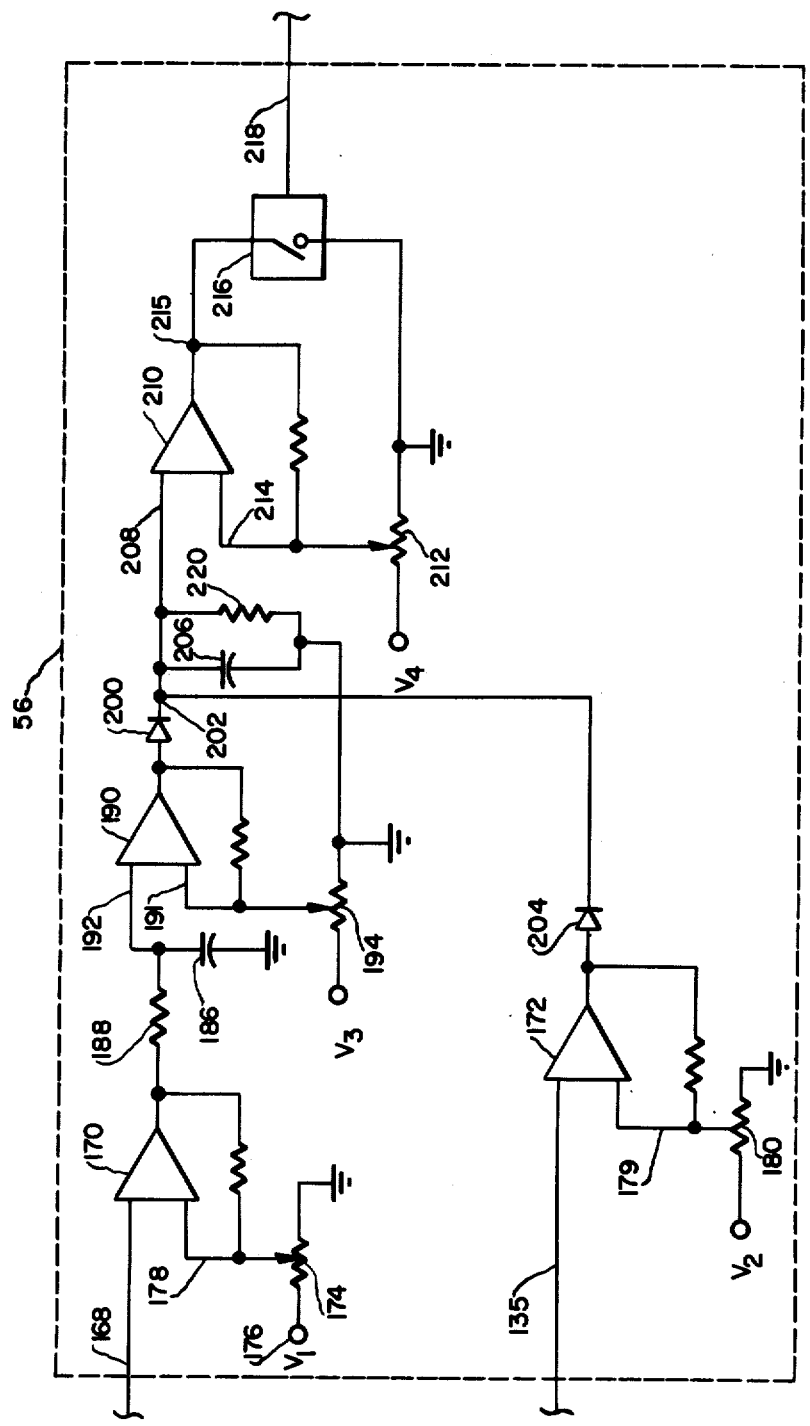
FIG. 5 is a diagram of the alarm system of the monitoring system.

The alarm system of FIG. 5 provides a means for comparing signals representing critical components of shaft vibration and phase currents with predetermined reference levels of these parameters and generating an alarm signal which in turn controls the recording of vibration and current signals determined in networks 52 and 54 of the monitoring system. To determine whether an alarm signal should be generated, the composite current signal from phase current network 54 is fed along line 168 to comparator 170 of alarm system 56, and the second vibration signal from torsional vibration network 52 is fed along line 135 to comparator 172. The composite current signal is compared with a first reference signal which is produced by applying a constant voltage source $V_1$ at terminal 176 and feeding a signal through adjustable resistor 174 and line 178 to comparator 170, and the second vibration signal is compared with a second reference signal applied to comparator 172 through adjustable resistor 180 and along line 179 by constant voltage source $V_2$. If the composite current signal exceeds the first reference signal, comparator 170 produces a positive output signal and charges capacitor 186 through resistor 188 and directs a signal to comparator 190 by line 192. Capacitor 186 and resistor 188, together with the adjustable voltage signal applied to comparator 190 through adjustable resistor 194 and along line 191 by constant voltage source $V_3$, provide a short delay such as five seconds to prevent line current transients from fully activating the alarm system. If the output of comparator 170 remains positive after expiration of the delay, comparator 190 produces a positive output signal which is fed through diode 200 to point 202. A signal indicative of torsional vibrations in excess of the second reference level may also be received at point 202 from comparator 172 through diode 204, diodes 200 and 204 thus functioning as an OR logic gate. A signal entering point 202 from either diode 200 or 204 charges capacitor 206 and is fed by line 208 to comparator 210. If this signal exceeds an adjustable voltage signal applied to comparator 210 through adjustable resistor 212 and along line 214 by constant voltage source $V_4$, comparator 210 produces a positive output signal at point 215, which energizes relay 216, in turn directing an alarm signal along line 218 to recorder 57 to initiate recording of phase current signals received through lines 151, 152, and 153 and a torsional vibration signal received through line 117. To ensure that these signals are recorded for a time interval of sufficient duration, the adjustable voltage signal applied to comparator 210 of alarm system 56 and the impedances of capacitor 206 and resistor 220 are chosen such that the output of comparator 210 remains positive for a time interval (such as 30 seconds) after the outputs of comparators 170 and 172 go negative.

Also, to obtain an accurate representation of the beginning of any dynamic response sufficient to initiate recording of signals, recorder 57 is preferably of the type wherein signals are not recorded directly on tape but first recorded continuously on a rotating magnetic drum, then transferred to tape upon receipt of an alarm signal.

In operation, probes 44, 46, 48, and 50 spaced around turbine-generator shaft 26 direct electrical signals including true components of shaft torsional vibration and false components to vibration network 52, and generator phase lines 28, 30, and 32 direct a set of three stepped-down line current signals to phase current network 54. In vibration network 52, phase discriminators 60, 62, 64, and 66 combine the electrical signals to produce three combined signals which have eliminated therefrom false components at predetermined frequencies that are multiples of the rate of rotation of shaft 26, then filter network 82 selectively filters and adds the combined signals to form a single combined vibration signal at point 58 which contains no false components and includes all true components of torsional vibration of interest. The combined vibration signal at point 58 is directed to recorder 57 and also amplified and compared with selected amplified components to produce a second vibration signal at point 128 which is fed to alarm system 56.

In phase current network 54, the levels of stepped down line current signals are adjusted, the 60 hertz power generation frequencies are removed, then the resulting signals are amplified to form phase current signals which are directed to recorder 57. Components of the phase current signals at selected frequencies such as 300 and 420 hertz are bandpass-filtered, combined, and amplified, and a composite current signal is determined at point 154 as the maximum of the three resulting signals. The composite current signal at 154 and the second vibration signal at 58 are fed to alarm system 56, where they are compared with adjustable reference signals. If the composite current signal exceeds its reference level for at least a specified time interval and/or the second vibration signal exceeds its reference level, an alarm signal is generated, energizing relay 216, which activates recorder 57 to record phase current signals from lines 151, 152, and 153 and a torsional vibration signal from line 17.

Although a preferred embodiment of the invention has been shown and described, it is understood that various modifications may be made therein. For example, the alarm system used to control recording of vibration and current signals may also be utilized to generate an audible or visual alarm or to initiate reduction of turbine-generator load. It is intended by the appended claims to claim all modifications and embodiments which fall within the true spirit and scope of the present invention.

What is claimed is:

1. A system for monitoring phase currents and torsional vibrations of a three-phase turbine-generator comprising:
    a phase current network operable to produce three phase current signals in response to the three line currents of said turbine-generator and to determine a composite current signal from preselected harmonics of said phase current signals;
    a plurality of probes locatable adjacent a shaft of said turbine-generator for sensing the rate of rotation of said shaft and providing a plurality of electrical signals which include true components representing torsional vibrations of said shaft and which may include false components at frequencies that are multiples of the rate of rotation of said shaft;
    a torsional vibration network operable to combine said electrical signals to produce a first vibration signal containing only true components of torsional vibrations of said shaft and a second vibration signal derived from said first vibration signal and components thereof;
    an alarm system adapted to compare said composite current signal with a first reference level and to compare said second vibration signal with a second reference level and to generate an alarm signal if at least one of said reference levels is exceeded; and
    a recorder operable in response to said alarm signal to record said first vibration signal and said phase current signals.

2. The monitoring system of claim 1 wherein said probes comprise first, second, third, and fourth magnetic pickup devices and said second, third, and fourth devices are separated from said first device by angles of 180, 90, and 45°, respectively.

3. The monitoring system of claim 1 wherein said harmonics are the fifth and seventh harmonics of each of said three phase current signals, and said phase current network includes means for combining said fifth and seventh harmonics of each of said phase current signals to form three intermediate signals and means for determining said composite current signals as the maximum of said three intermediate signals.

4. The monitoring system of claim 1 wherein said torsional vibration network includes means for amplifying said first vibration signal to form an amplified signal and for means for determining said second vibration signal as the maximum of said amplified signal and amplified 120 hertz and 300 hertz components thereof.

5. The monitoring system of claim 1 wherein said alarm system includes means such that after an alarm signal is generated, said alarm signal is maintained for a preselected time interval after neither of said reference levels is exceeded.

6. The monitoring system of claim 2 wherein said torsional vibration network includes first, second, third, and fourth phase discriminators each operable to receive an electrical signal from one of said probes, and wherein said second discriminator is connected to said first discriminator to produce therewith a first combined signal having no false components at frequencies equal to $(2m + 1)f_o$ where m is an integer $0,1,2,\ldots$, and $f_o$ is the rate of rotation of said shaft.

7. The monitoring system of claim 6 wherein said third discriminator is connected to said first discriminator to produce therewith a second combined signal having no false components at frequencies equal to $(2m + 1)2f_o$.

8. The monitoring system of claim 7 wherein said fourth discriminator is connected to said first discriminator to produce therewith a third combined signal having no false components at frequencies equal to $(2m + 1)4f_o$.

9. The monitoring system of claim 8 wherein said torsional vibration network includes means operable to determine said first vibration signal from said combined signals such that said first vibration signal includes no false components and includes true components of torsional vibration of said shaft at all frequencies below 500 hertz except at 240, 420, and 480 hertz.

* * * * *